(12) United States Patent
Fariello et al.

(10) Patent No.: US 8,891,929 B2
(45) Date of Patent: Nov. 18, 2014

(54) SLIDING HOLDER HAVING FLEXIBLE CABLE SUPPORT

(75) Inventors: Patrick Lee Fariello, Murphy, TX (US); Charles T. Crain, Melissa, TX (US)

(73) Assignee: CommScope, Inc. of North Carolina, Hickory, NC (US)

( * ) Notice: Subject to any disclaimer, the term of this patent is extended or adjusted under 35 U.S.C. 154(b) by 171 days.

(21) Appl. No.: 13/556,995

(22) Filed: Jul. 24, 2012

(65) Prior Publication Data

US 2013/0034334 A1    Feb. 7, 2013

Related U.S. Application Data

(60) Provisional application No. 61/513,846, filed on Aug. 1, 2011.

(51) Int. Cl.
| | |
|---|---|
| *G02B 6/46* | (2006.01) |
| *A47B 96/02* | (2006.01) |
| *H05K 5/02* | (2006.01) |
| *H04Q 1/06* | (2006.01) |
| *H05K 7/14* | (2006.01) |
| *G02B 6/44* | (2006.01) |
| *H04Q 1/02* | (2006.01) |

(52) U.S. Cl.
CPC ............... *H04Q 1/06* (2013.01); *H05K 7/1491* (2013.01); *G02B 6/4455* (2013.01); *H04Q 1/023* (2013.01); *G02B 6/4452* (2013.01); *G02B 6/4471* (2013.01)
USPC .......................................... 385/135; 385/147

(58) Field of Classification Search
USPC ........................................ 385/135–139, 147
See application file for complete search history.

(56) References Cited

U.S. PATENT DOCUMENTS

| | | |
|---|---|---|
| 5,339,379 A | 8/1994 | Kutsch |
| 6,792,190 B2 | 9/2004 | Xin |
| 7,798,762 B2 * | 9/2010 | Baba ........................... 414/749.1 |
| 2006/0028519 A1 * | 2/2006 | Nakamura et al. .............. 347/87 |

* cited by examiner

*Primary Examiner* — Akm Enayet Ullah
(74) *Attorney, Agent, or Firm* — Muncy, Geissler, Olds & Lowe, P.C.

(57) ABSTRACT

A device includes a support, a first slide element slidably mounted on the support and shiftable in a first direction from a retracted position to an extended position relative to the support, and a flexible member having first and second ends and a central portion. The first end is attached to the first slide element, the second end is fixedly mounted to the support, and the central portion projects away from the first and second ends in the second direction. The second end remains fixed to the support and the first end moves with the first slide element when the first slide element is shifted from the retracted position to the extended position.

20 Claims, 5 Drawing Sheets

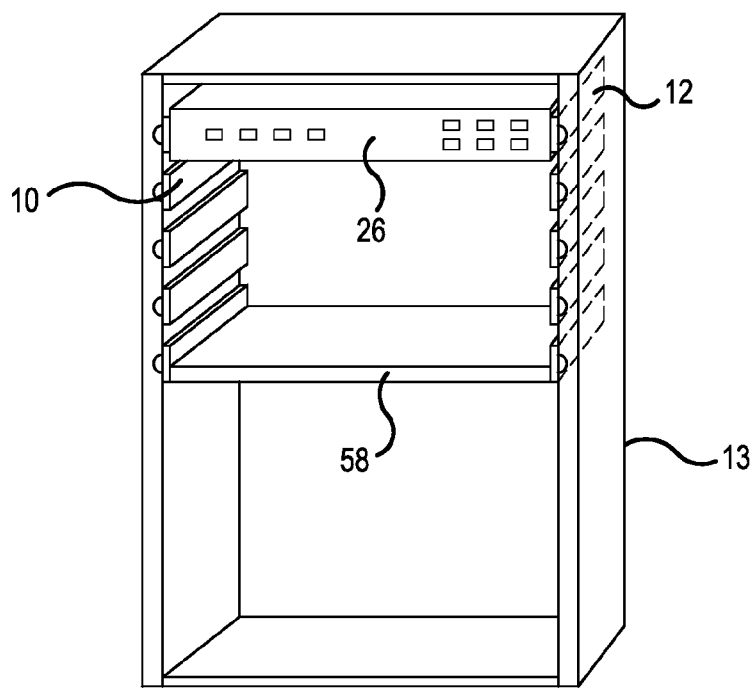
FIG.6
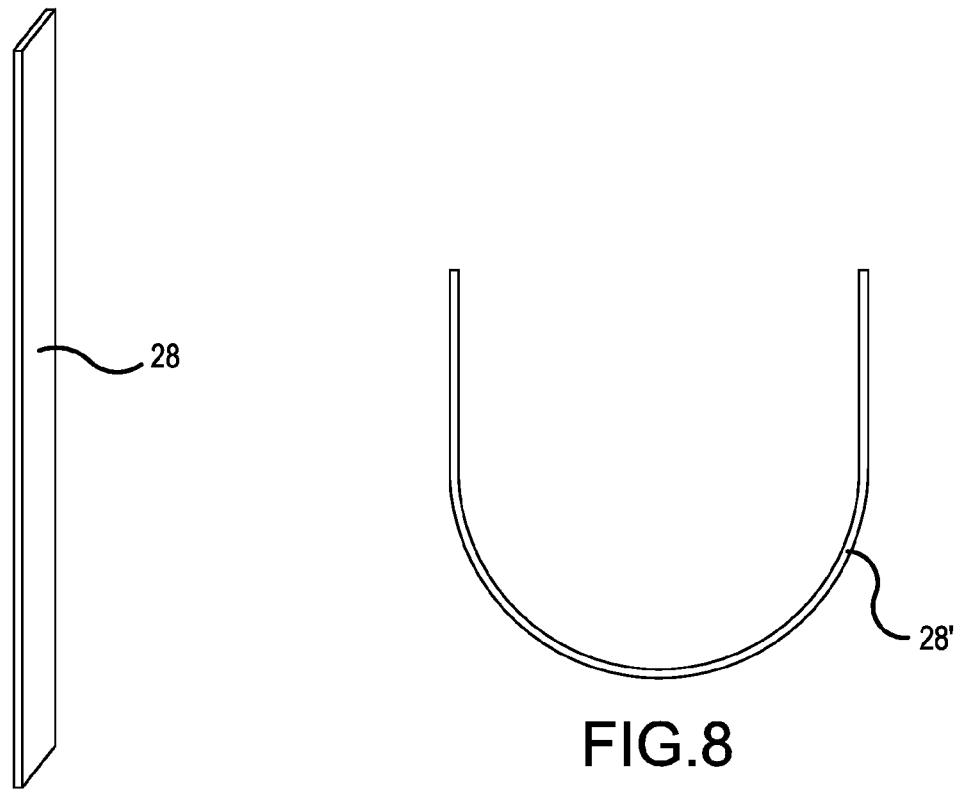
FIG.7
FIG.8

SLIDING HOLDER HAVING FLEXIBLE CABLE SUPPORT

CROSS-REFERENCE TO RELATED APPLICATIONS

The present application claims the benefit of U.S. Provisional Patent Application No. 61/513,846, filed Aug. 1, 2011, the entire contents of which are hereby incorporated by reference.

FIELD OF THE INVENTION

The present invention is directed to a support for slidably supporting a component and a flexible member connected between the support and the component for supporting, for example, optical cables connected to the component, and, more specifically, to a support that includes a sliding element and a frame element and a flexible band of material connected to the sliding element and to the frame element which flexible band provides an attachment location for supporting, for example, optical cables connected to the component as the sliding element moves relative to the frame element.

BACKGROUND OF THE INVENTION

Computer and/or telecommunications components are often mounted in a rack and may be slidably connected to the rack so that individual ones of the components can be pulled out from the front of the rack for service or easier access. Many such components have cables connected to their rear portions, which cables may contain optical fibers or electrical wires. Care must be taken when sliding a component in and out of a rack that the cables do not become tangled with cables attached to other components or pinched between the moving component and another element. In the case of optical fibers the minimum bend radius of the fibers in the cable must not be exceeded as the cable flexes with the movement of the component. These problems may be avoided by mounting the component on a flat shelf surface and providing room on the shelf surface for holding an extra length of fiber to provide slack when the component moves. However, the slack cable on the shelf may not coil and uncoil properly when the component moves unless appropriate guiding structures are provided on the shelf. It would therefore be desirable to provide a support structure that supports and maintains cables in a desired configuration while the components connected to the cables move.

SUMMARY OF THE INVENTION

These problems and others are addressed by embodiments of the present invention, a first aspect of which comprises a device that includes a support and a first slide element that is slidably mounted on the support and that is shiftable in a first direction from a retracted position to an extended position relative to the support. The device also includes a flexible member having first and second ends and a central portion. The first end of the flexible member is attached to the first slide element, the second end is fixedly mounted to the support, and the central portion projects away from the first and second ends in the second direction. The second end remains fixed to the support, and the first end moves with the first slide element when the first slide element is shifted from the retracted position to the extended position.

Another aspect of the invention comprises a device that includes a support and a first slide element slidably mounted to the support that is shiftable from a retracted position to an extended position relative to the support. The device also includes an electrical or optical component mounted to the first slide element, optical fibers connected to the electrical or optical component, and flexible mount means for supporting the optical fibers. The flexible mount means is connected between the first slide element and the support.

A further aspect of the invention comprises a device having a support and a shelf slidably mounted on the support which shelf is shiftable in a first direction from a retracted position to an extended position relative to the support. The device also includes a flexible band having first and second ends and a central portion. The first end of the band is connected to the shelf, the second end of the band is connected to the support and the central portion is spaced from and does not overlie the shelf.

BRIEF DESCRIPTION OF THE DRAWINGS

These and other aspects and features of embodiments of the present invention will be better understood after a reading of the following detailed description together with the attached drawings wherein:

FIG. 6 is a front elevational view of a rack for slidably supporting telecommunications components.

FIG. 7 is a perspective view of a flexible band according to a first embodiment.

FIG. 8 is a top plan view a flexible band according to a second embodiment.

DETAILED DESCRIPTION

Figure 1:
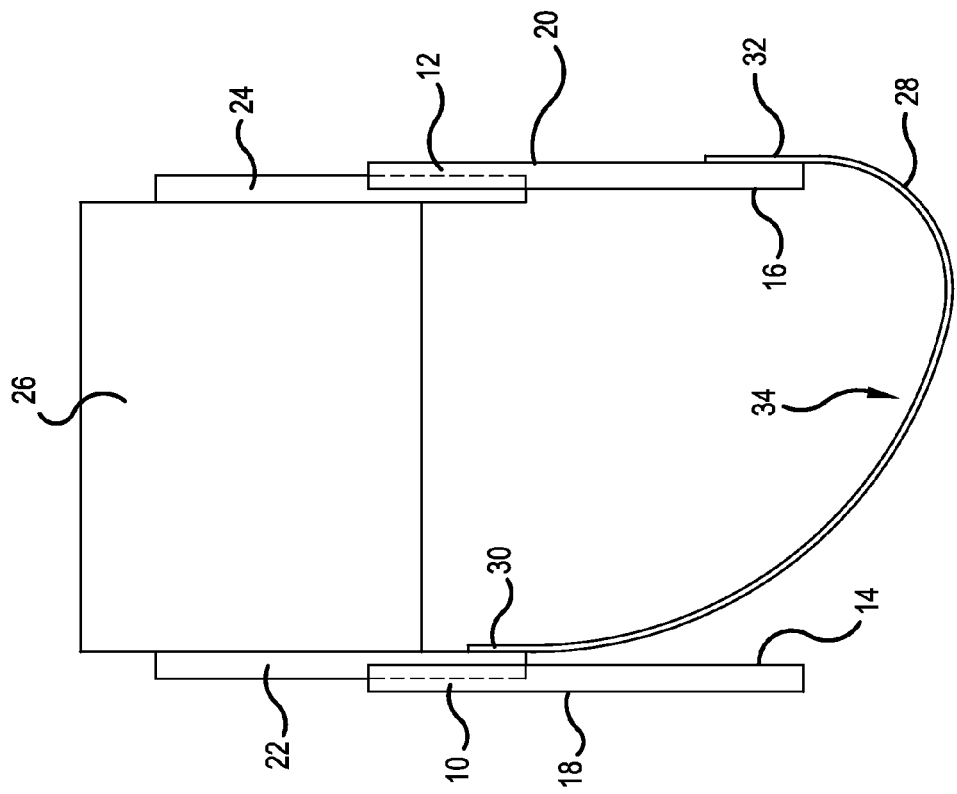
FIG. 1 is top plan view of a telecommunications component connected to first and second slide elements slidably mounted on support elements in a retracted position relative to the support elements and a flexible band connected from one of the slide elements to the support.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

Figure 2:
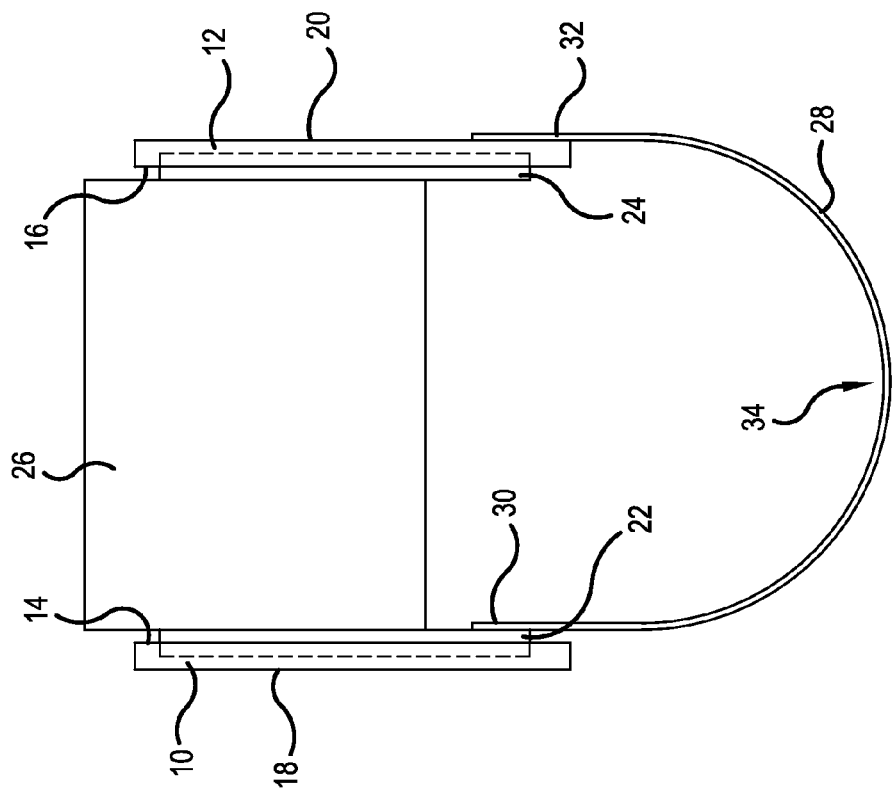
FIG. 2 is a top plan view of the telecommunications component of FIG. 1 in an extended position relative to the support elements.

Referring now to the drawings, FIG. 1 depicts a support formed of a first support element 10 and a second support element 12 which first and second support elements 10, 12 may extend along the sides of a conventional equipment rack 13 as illustrated in FIG. 6. The first support element 10 includes an inner side 14 facing an inner side 16 of the second support element 12 and an outer side 18. The second support element 12 also includes an outer side 20 facing away from the first support element 10. A first slide element 22 is slidably mounted on the first support element 10 and a second slide element 24 is slidably mounted on the second support element 12 so that the first and second slide elements 22, 24 can slide in a first direction from a retracted position, illustrated in FIG. 1, to an extended position, illustrated in FIG. 2. In FIGS. 1 and 2, the first and second slide elements 22 and 24 are not connected to each other and can slide independently of one another. In use, however, the first and second slide elements 22, 24 are affixed to opposite sides of an optical or electronic component 26 and thus move together as the component 26 moves between retracted and extended positions. Stops (not illustrated) may be provided in a conventional manner to limit movement of the first and second slide elements 22, 24 relative to the first and second supports 10, 12 to prevent the component 26 from being completely removed from the equipment rack 13 in the first direction or in a second direction opposite to the first direction.

A flexible member or band 28 has a first end 30 attached to the first slide element 22 and a second end 32 attached to the second support 12. The band 28 is U-shaped, has a rectangular cross section and includes a concave central portion 34 spaced from and facing the component 26. The location of the second end 32 of the band 28 is fixed relative to the second support element 12 while the first end 30 of the band 28 moves with the first slide element 22 as it slides between retracted and extended positions. The band 28 may be formed from a resilient material such as acrylonitrile-butadiene-styrene (ABS), another flexible plastic or spring steel. The shape of the band 28 allows it to flex in the first direction while staying rigid in a perpendicular direction so that the band 28 does not droop even when a load is attached thereto. To this end, the band has a vertical dimension sufficiently long to withstand bending when loaded and a horizontal cross section sufficiently short enough to allow for deflection "bending" of the band.

Figure 5:
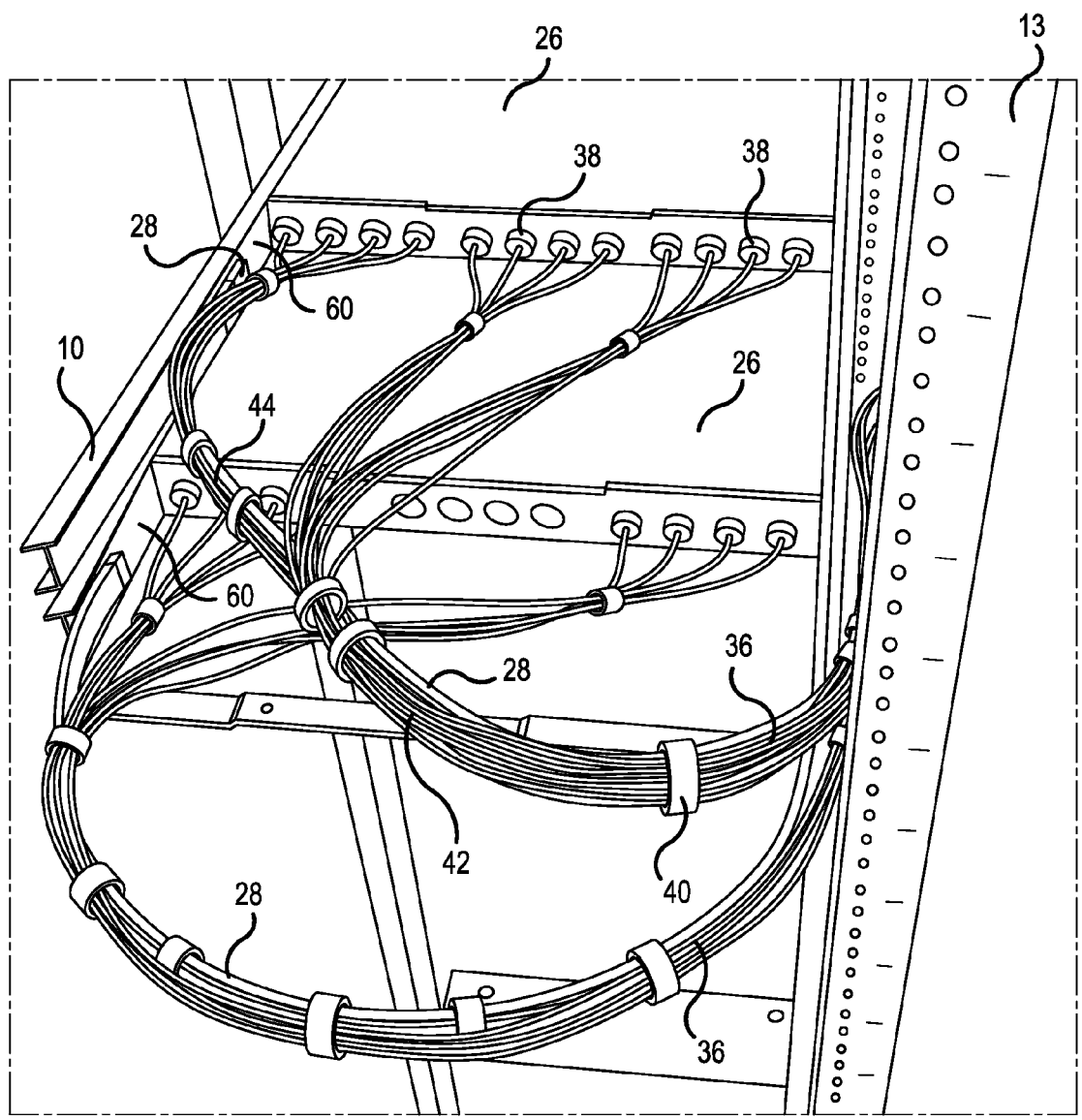
FIG. 5 is a perspective view of first and second telecommunications components slidably mounted between supports and flexible bands connected between the supports and each piece of telecommunications equipment.

The band 28 serves as a support for a bundle of cables 36, illustrated in FIG. 5, which may comprise optical fibers or copper wires, for example, which approach the second support element 12 from the outer side 20 of the second support element 12, travel along a portion of the band 28 and then pass over the top of the band 28 and connect to jacks 38 on the back of the component 26. Straps 40, which may comprise lengths of hook and loop fastener material, for example, secure the bundle 36 to the band 28 at various locations. A first group 42 of the cables 36 is connected to the band 28 along a first length of the band 28 before passing over the band 28 and connecting to the jacks 38. A second group 44 of the cables 36 is connected to the band 28 at more locations than the first group 42 of cables and therefore follows the curvature of the band 28 for a greater distance before passing over the top of the band 28 and connecting to the jacks 38. Connecting first and second groups 42, 44 of the cables 36 in this manner may allow for better control over the movement of the cables as the component 26 moves between extended and retracted positions.

Two components 26 are illustrated in FIG. 5, and the upper component 26 is shown in an extended position while the lower component 26 is shown in a retracted position relative to the rack 13. In both the extended and retracted configurations, the bend radius of the cables 36 is controlled and the band 28 secures the bundles of cables 36 at approximately the same level as the components 26 to which each bundle is attached to prevent the cables 36 from drooping and becoming entangled with the cables 36 at other levels of the rack 13.

Figure 3:
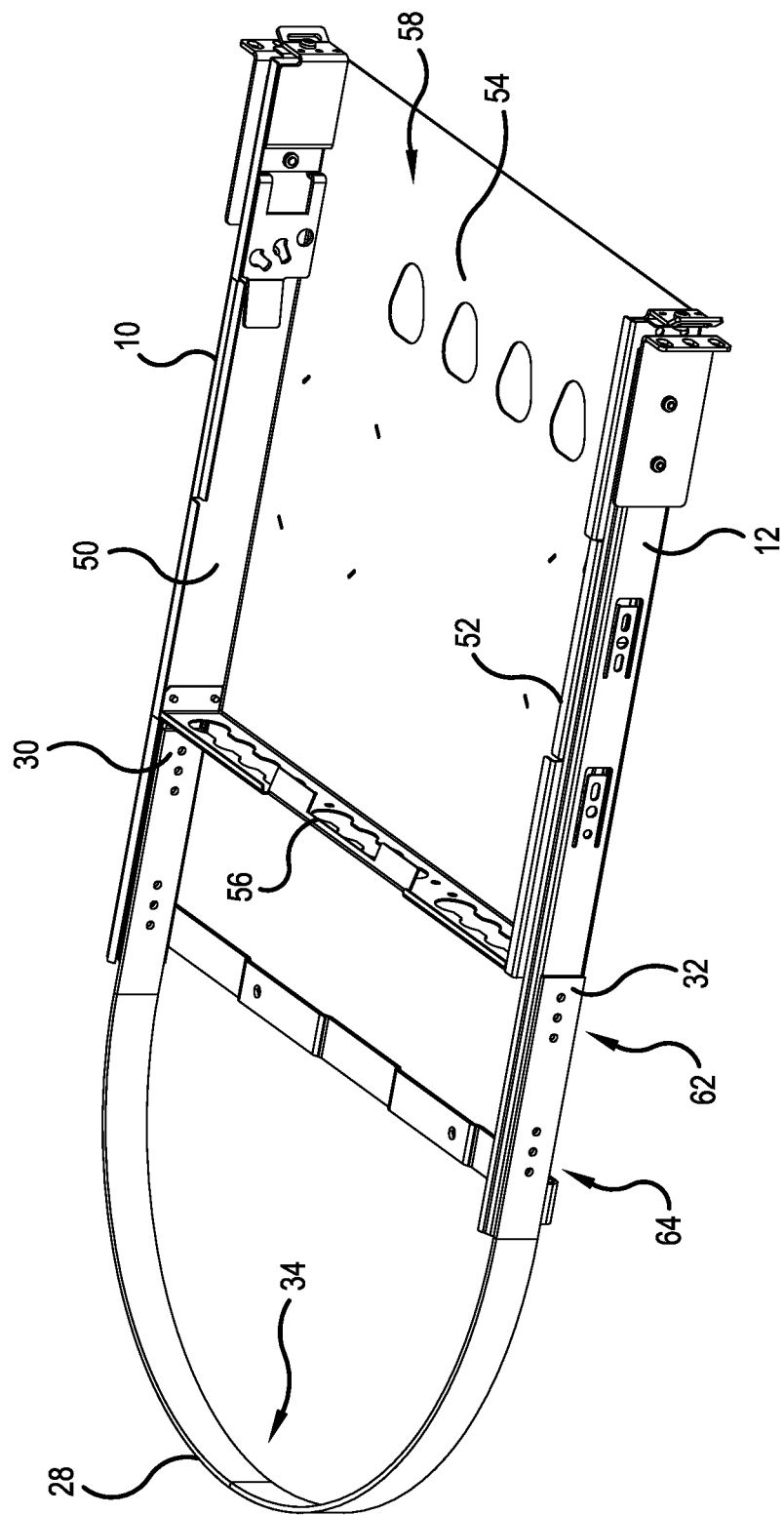
FIG. 3 is a perspective view of a shelf slidably mounted between first and second support elements and a flexible band connected from one of the support elements to the shelf.
Figure 4:
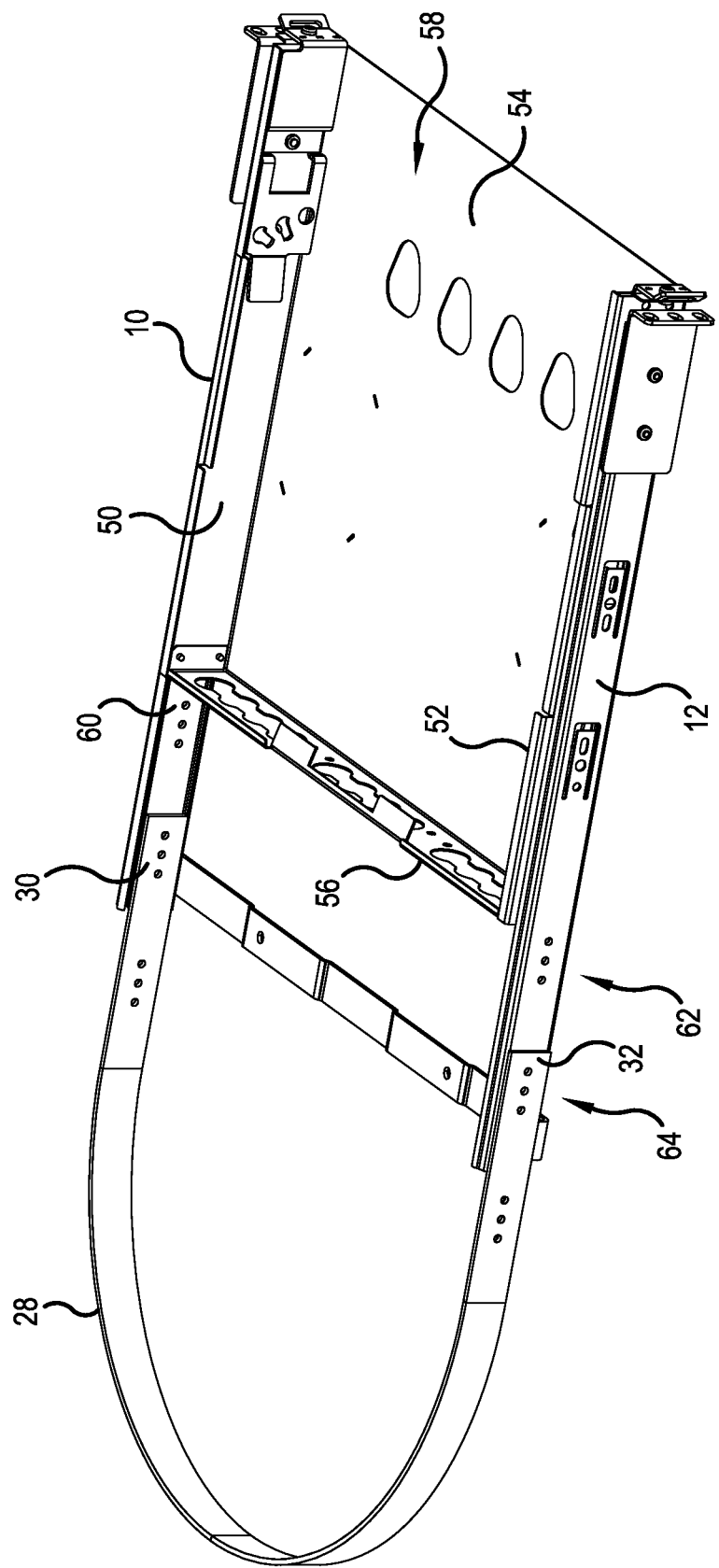
FIG. 4 is a perspective view of the shelf of FIG. 3 with the flexible band attached in an alternate manner.

FIGS. 3 and 4 illustrate a second embodiment of the present invention in which like reference numerals are used to identify elements common to the first embodiment. In this embodiment, first and second slide elements 50 and 52, are slidably connected to the first and second supports 10, 12 respectively. The first slide 50 is connected to the second slide element 52 by a platform 54 and a rear wall 56 to form a sliding shelf 58. Rather than mounting electrical or optical components directly to first and second side elements 22, 24 as in the first embodiment, the shelf 58 provides a sliding support for a component (not illustrated). An extended portion 60 of the first slide element 50 (best seen in FIG. 4)

extends beyond the rear wall 56 of the shelf 58 to provide an attachment location for the first end 30 of the band 28. Bundles of cables are not specifically illustrated in FIGS. 3 and 4 but attach to the band 28 in the same manner as in the first embodiment. The central portion 34 of the band 28 projects away from and does not overlie the shelf 58.

The first and second support elements 10, 12 each include a first set of mounting holes 62 and a second set of mounting holes 64 to allow the band 28 to attach to the first and second support elements 10, 12 in two different locations. FIG. 3 shows the band 28 connected to the first sets 62 of mounting holes while FIG. 4 shows the band 28 connected to the second sets 64 of mounting holes. A comparison of these two figures shows that the central portion 34 of the U-shaped band 28 is located closer to the rear wall 56 of the shelf 58 when the band 28 is connected to the first set 62 of mounting holes in FIG. 3 than when the band 28 is connected to the second set of mounting holes 64 in FIG. 4. When the band 28 is mounted to the second set 64 of mounting holes, the shelf 58 has a greater range of travel relative to the supports; however, in this case, the band 28 also projects further away from the rear wall 56 of the shelf 58 and thus more clearance is required to the rear of the rack 13 in which the shelf 58 is mounted.

FIG. 7 illustrates the band 28 when it is in a rest state in which no forces are applied thereto. The band 28 in the rest state is linear and thus it must be bent into a U-shape in order to connect it between the first slide element 22 and the second support element 12 as illustrated in FIGS. 1 and 2. When bent and then released, the band 28 tends to return to this linear rest configuration. The amount of energy stored by the band 28 as the component 26 is moved between extended and retracted positions of FIGS. 1 and 2 does not change substantially, and the band 28 thus does not tend to aid or resist the movement of the component 26 between extended and retracted positions.

FIG. 8 illustrates an alternate band 28' in a rest configuration. The band 28' is U-shaped in its rest configuration and, when it is deformed and then released, tends to return to this rest configuration. The band 28' may be used in place of the band 28 in FIGS. 1 and 2. When the band 28' is connected between the first slide element 22 and the second support element 12 in FIG. 1, the band 28' is either in or only slightly deformed from its rest configuration and applies little if any force against the first and second slide elements 22, 24. However, moving the first and second slide elements 22, 24 to the extended position of FIG. 2 deforms the band 28' from its rest position, and the band 28' tends to pull the first and second slide elements 22, 24 back toward the retracted position when the first and second slide elements 22, 24 are moved to or toward the extended positions of FIG. 2. The band 28' thus helps return the first and second slide elements 22, 24 to the retraced configuration when a force holding them in the extended position is released.

The present invention has been described herein in terms of presently preferred embodiments. Modifications and additions to these embodiments will become apparent to those of ordinary skill in the art upon a reading of the foregoing disclosure. It is intended that all modifications and additions to these embodiments comprise a part of the present invention to the extent they fall within the scope of the several claims appended hereto.

What is claimed is:

1. A device comprising:
    a support;
    a first slide element slidably mounted on the support and shiftable in a first direction from a retracted position to an extended position relative to the support; and
    a flexible member having first and second ends and a central portion, the first end being attached to the first slide element, the second end being fixedly mounted to the support, and the central portion projecting away from the first and second ends in a second direction, the second end remaining fixed to the support and the first end moving with the first slide element when the first slide element is shifted from the retracted position to the extended position.

2. The device of claim 1, wherein the flexible member comprises a band.

3. The device of claim 2, wherein the band is resilient.

4. The device of claim 2, wherein the support includes first and second spaced support elements, wherein the first slide element is slidably mounted to the first support element and the second end of the band is mounted to the second support element, and including a second slide element slidably mounted to the second support element.

5. The device of claim 4, including a platform connected to the first and second slide elements and movable with the first and second slide elements.

6. The device of claim 2, wherein the band has a rest shape when the band is not connected to the support or the first slide element, a retracted shape when the band is connected to the support and to the first slide element and the first slide element is in the refracted position, and an extended shape when the band is connected to the support and to the first slide element and the first slide element is in the extended position, wherein, when the first slide element is in the extended position, the band is configured to return toward the rest shape and pull the first slide element toward the retracted position.

7. The device of claim 2 including an electrical or optical component mounted to the first slide element and a plurality of optical fibers attached to and supported by the band and connected to the electrical or optical component.

8. The device of claim 7, wherein the plurality of optical fibers include a first group of optical fibers and a second group of optical fibers, the first group of optical fibers being attached to the band so that the first group of optical fibers conforms to a curvature of the band for a first distance and the second group of optical fibers being attached to the band so that the second group of optical fibers conforms to the curvature of the band for a second distance greater than the first distance.

9. The device of claim 4, wherein a first end portion of the band including the band first end overlies a portion of the first slide element and wherein a second end portion of the band including the band second end overlies a portion of the second support element.

10. The device of claim 9, wherein the second support element and the first slide element each include a first band mounting location and a second band mounting location positioned such that when the band is mounted to the first slide element and to the second support element at the first band mounting locations the band overlies a greater area of the second support element and a greater area of the first slide element than when the band is mounted to the first slide element and to the second support element at the second band mounting locations.

11. The device of claim 2, wherein the band has a rectangular cross section.

12. The device of claim 2, wherein the band is formed from acrylonitrile-butadiene-styrene (ABS).

13. A device comprising:
    a support;
    a first slide element slidably mounted to the support and shiftable from a retracted position to an extended position relative to the support;

an electrical or optical component mounted to the first slide element;

optical fibers connected to the electrical or optical component; and flexible mount means for supporting the optical fibers, the flexible mount means being connected between the first slide element and the support.

14. The device of claim 13, wherein the flexible mount means has a first end attached to the first slide element and a second end fixedly attached to the support.

15. The device of claim 14, wherein the flexible mount means comprises a resilient band.

16. A device comprising:
a support;
a shelf slidably mounted on the support and being shiftable in a first direction from a refracted position to an extended position relative to the support; and
a flexible band having first and second ends and a central portion, the first end being connected to the shelf, the second end being connected to the support and the central portion being spaced from and not overlying the shelf.

17. The device of claim 16, wherein the support has a first side and a second side, the shelf has a first side at the first side of the support and a second side at the second side of the support and wherein the first end of the flexible band is connected to the first side of the shelf and the second end of the flexible band is connected to the second side of the support.

18. The device of claim 16, wherein the flexible band is resilient.

19. The device of claim 18, including a electrical or optical component on the shelf and a plurality of electrical or optical cables connected to the electrical or optical component and to the resilient band.

20. The device of claim 13, wherein the electrical or optical component is mounted to the first slide element via a shelf.

* * * * *